United States Patent
Hwang et al.

(10) Patent No.: US 6,680,163 B2
(45) Date of Patent: Jan. 20, 2004

(54) METHOD OF FORMING OPENING IN WAFER LAYER

(75) Inventors: Jiunn-Ren Hwang, Hsinchu (TW); I-Hsiung Huang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/328,769

(22) Filed: Dec. 23, 2002

(65) Prior Publication Data

US 2003/0129543 A1 Jul. 10, 2003

Related U.S. Application Data

(63) Continuation-in-part of application No. 09/729,575, filed on Dec. 4, 2000.

(51) Int. Cl.$^7$ .................................. G03C 5/56
(52) U.S. Cl. ................. 430/312; 430/313; 430/311; 430/330; 430/317; 430/394
(58) Field of Search .................. 430/311–313, 330, 430/317, 394

(56) References Cited

U.S. PATENT DOCUMENTS 4,524,121 A * 6/1985 Gleim et al. ................. 430/176

* cited by examiner

Primary Examiner—Mark F. Huff
Assistant Examiner—Daborah Chacko Davis
(74) Attorney, Agent, or Firm—J.C. Patents

(57) ABSTRACT

A method of forming an opening in a wafer layer is described. At least two patterned photoresist layers are formed on a wafer layer. Each photoresist layer comprises patterns of various configurations. The photoresist layers are stacked to form an opening pattern that expose the underlying wafer layer by superpositioning the space between the patterns in the first photoresist layer and the space between the patterns in the second photoresist layer. The wafer layer exposed by the opening pattern is then etched to form an opening.

16 Claims, 3 Drawing Sheets

METHOD OF FORMING OPENING IN WAFER LAYER

CROSS-REFERENCE TO RELATED APPLICATION

This application is a continuation-in-part of prior application Ser. No. 09/729,575, filed Dec. 4, 2000.

BACKGROUND OF THE INVENTION

1. Field of the Invention

The invention relates in general to a photolithography and etching process of a semiconductor fabrication process. More particularly, this invention relates to a method of forming an opening in a wafer layer.

2. Description of the Related Art

As the dimension of a semiconductor device is further being scaled down, techniques such as phase shift mask (PSM) or optical proximity correction (OPC) mask is used during the exposure process to improve the profile of a photoresist pattern. However, when the pattern dimension is smaller than a half of the wavelength of the light source, the diffraction effect becomes significant. Especially in the case of a contact hole/via hole type of photoresist pattern, the profile of the pattern cannot be effectively improved using a phase shift mask.

Further, since the application of the optical proximity correction mask requires fine corrections to the photomask pattern, the design and the fabrication of the photomask becomes tedious. When the pitch of the pattern is too small, there is no space for forming the assistant features on the photomask. As a result, the photoresist layer pattern may suffer from corner rounding. The resulting opening in the wafer layer is likely formed with a rounded profile. The exact shape, cross sectional area and resistance of the contact hole/via hole are thus difficult to control.

SUMMARY OF THE INVENTION

A method of forming an opening in a wafer layer is provided. At least two patterned photoresist layers are formed on a wafer layer. Each photoresist layer comprises patterns of various configurations, wherein spaces are present between the patterns in each photoresist layer. The photoresist layers are stacked substantially over each other to form an opening pattern that exposes the underlying wafer layer by superpositioning the spaces between the patterns of two photoresist layers. The wafer layer exposed by the opening pattern is then etched to form an opening, for example, contact/via holes or trenches. Since there are no corner in the line/space type of pattern, the opening pattern resulted from the superpositioning of spaces between patterns of the photoresist layers can avoid corner rounding and the proximity effect. The profile and the cross-sectional area of the opening formed on the wafer layer in a subsequent etching process are thus easier to control.

Both the foregoing general description and the following detailed description are exemplary and explanatory only and are not restrictive of the invention, as claimed.

BRIEF DESCRIPTION OF THE DRAWINGS

FIG. 2A to FIG. 2C illustrate the process flow for the manufacturing of an opening on a wafer according to the one aspect of the present invention, wherein FIG. 2A is the cross-sectional view of FIG. 1A along the cutting line I–I', while FIG. 2C is a cross-sectional view of FIG. 1C along the cutting line II–II'.

DESCRIPTION OF THE EMBODIMENTS

FIG. 1A to FIG. 1D illustrate one aspect of the present invention. In this aspect of the present invention, a method of forming an opening in an insulation layer using two patterned photoresist layers is illustrated.

Figure 1A:
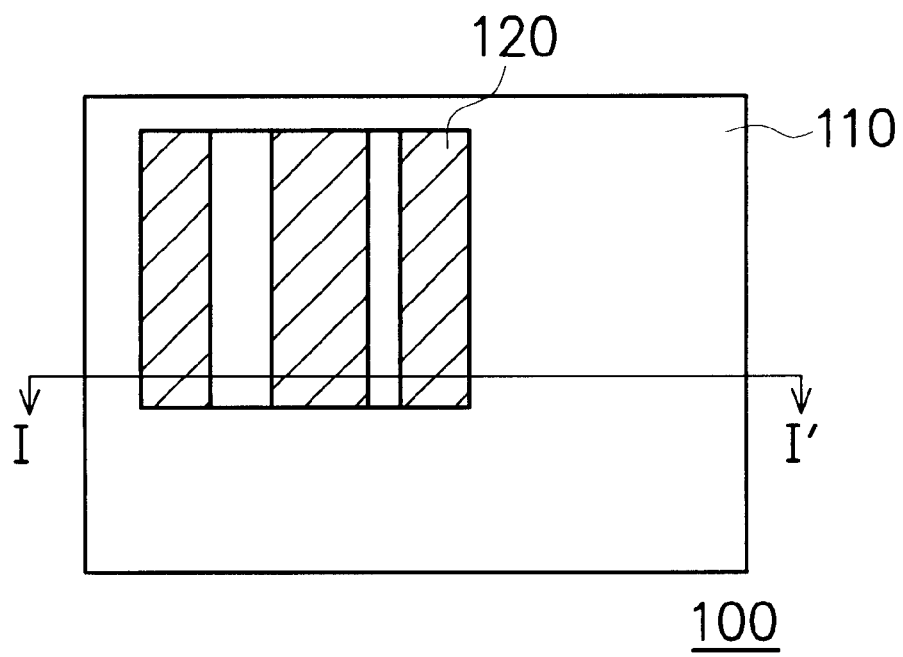
FIG. 1A to FIG. 1D illustrate the process flow for the manufacturing of an opening on a wafer according to one aspect of the present invention.

Referring to FIG. 1A, a substrate 100 is provided and insulation layer 110 is formed over the substrate 100. The substrate 100 includes a semiconductor substrate, which possibly comprises active and passive devices formed within the substrate and conductive layers and insulation layers formed over the substrate surface. As an example, the substrate 100 is a substrate for fabricating a memory device thereon, wherein a memory cell, for example, a metal oxide semiconductor (MOS) and a conductive lines (not shown) for electrical connection are also formed on the substrate 100. A first photolithography and etching step is performed to form a patterned photoresist layer 120 on the insulation layer 110, wherein the patterned photoresist layer 120 comprises patterns of various configurations, for example, block shape, L-shape, other regular or other irregular shapes. In this aspect of the present invention, the patterned photoresist layer 120 is a negative resist layer. The process for patterning the photoresist layer 120 comprises, for example, coating a photoresist material layer on the insulation layer 110 and then exposing the photoresist material layer using an exposure light source and a photomask. A soft bake step may perform to reduce the solvent amount in the photoresist material layer before exposing the photoresist material layer. Exposing the photoresist material comprises, for example, applying an excimer laser, which generates a light source with a wavelength of about 248 nm or 193 nm. Further, the exposing conditions can vary according to the pitch/size of the patterns. A post exposure bake (PEB) step is further performed followed by a development process. A hard bake process may also performed subsequent to the development process.

Figure 1B:
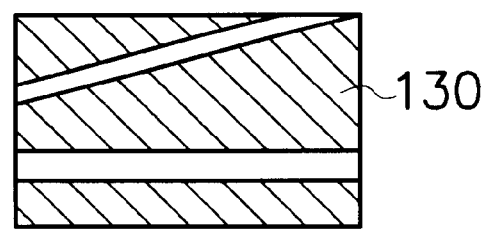
Figure 1C:
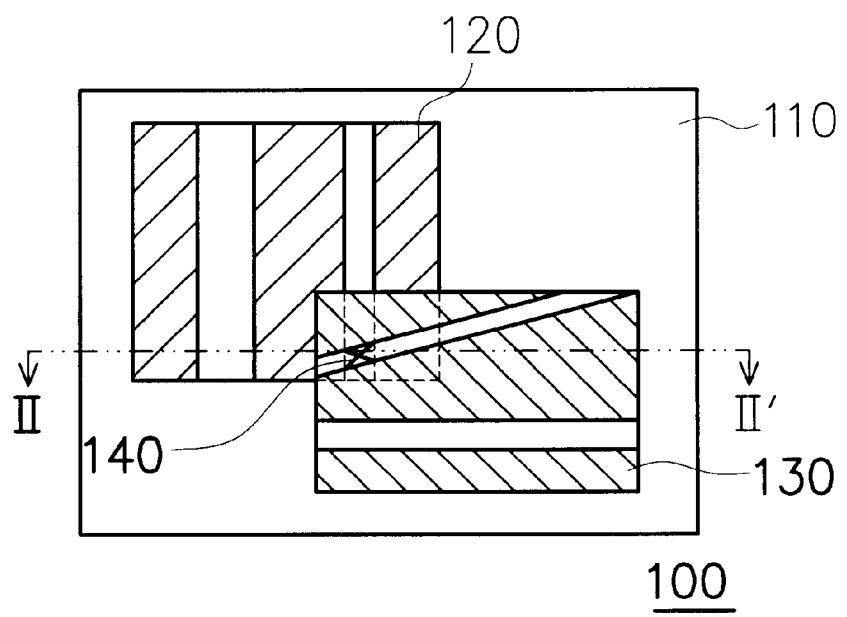
Figure 1D:
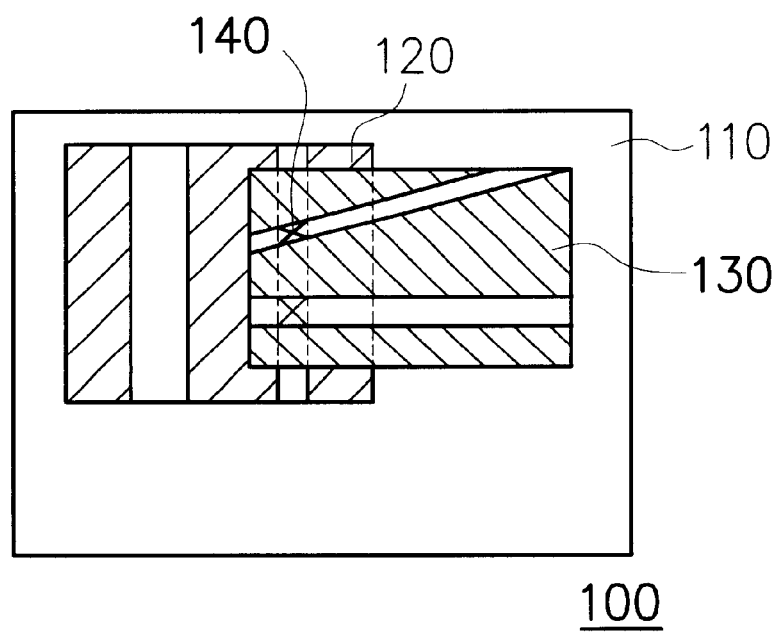

Thereafter, another patterned photoresist layer 130 is formed on the patterned photoresist layer 120. Referring to FIG. 1B, the patterned photoresist layer 130 is formed comprising patterns of various configurations, for example, L-shape, block shape, other regular or other irregular shapes. In this aspect of the present invention, a positive photoresist layer, for example, is selected for forming the photoresist layer 130. As shown in FIGS. 1C to 1D, the photoresist layer 130 is stacked, for example, substantially above the photoresist layer 120 or stacked offset to one side of the photoresist layer 120, wherein at least portions of the patterns from both photoresist layers 120 and 130 are superimposed to define an opening pattern 140. In other words, the opening pattern 140 is formed by the superposition of the spaces between the patterns in the photoresist layer 130 and the photoresist layer 120, and is defined by the sides of the neighboring patterns of the photoresist layer 120 and the photoresist layer 130. The steps for forming the photoresist layer 130 are similar to those for forming the patterned photoresist layer 120.

Figure 2A:
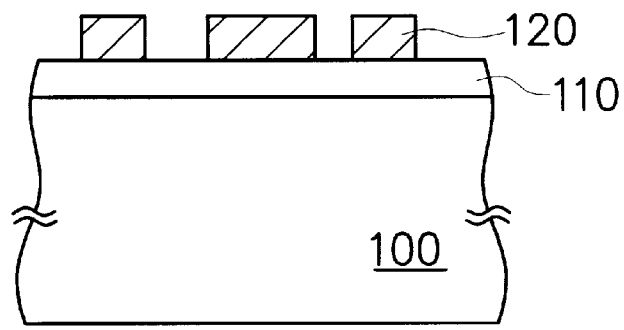
Figure 2B:
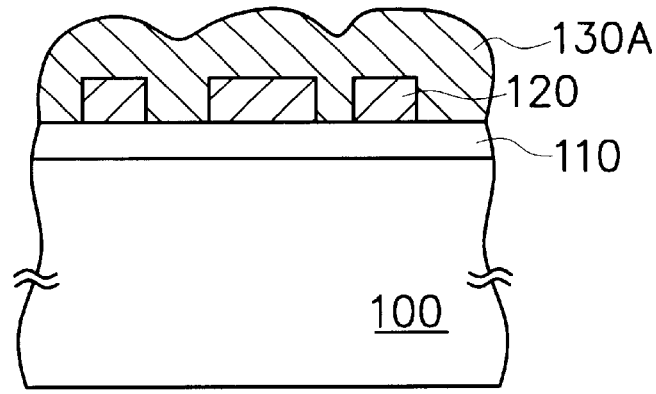
Figure 2C:
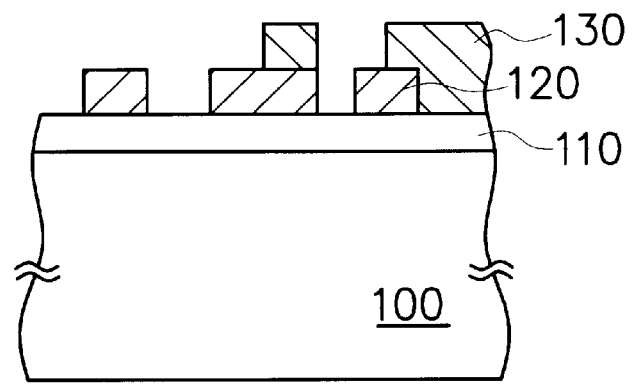

Referring to FIGS. 2A to 2B, FIG. 2A is the cross-sectional view of FIG. 1A along the cutting line I–I', while FIG. 2C is cross-sectional view of FIG. 1C along the cutting line II–II'. As shown in FIG. 2A, the patterned photoresist layer 120 is formed over the insulation layer 110. Thereafter, referring to FIG. 2B, a photoresist material layer 130a is coated on the insulation layer 110 and the photoresist layer 120. Continuing to FIG. 2C, the photoresist layer 130a is then planarized, for example, by chemical mechanical polishing or by an etching back process. A photomask and an excimer laser with a wavelength of about 248 nm to 193 nm are used as the exposure light source to expose the photoresist material layer 130a. A PEB step is further performed followed by a development process to form the patterned photoresist layer 130. Still referring to FIG. 2C, the opening pattern 140 exposes a portion of the insulation layer 110, wherein an opening can be formed in the insulation layer 110 using the opening pattern 140 as a mask.

According to this aspect of the present invention, the photoresist layer 120 a negative resist and the photoresist layer 130 is a positive photoresist. The photoresist layers 120 and 130, however, can be positive resists, negative resists or a positive resist and a negative resist, respectively. If the photoresist layers 120 and 130 are positive resists or negative resists, a single development process may conduct to pattern the photoresist layer 120 and photoresist layer 130 concurrently or they may be developed independently as described in the above.

In accordance to the present invention, a plurality of openings can be formed by stacking a multiple of photoresist patterns, wherein each photoresist layer can either be a positive resist or a negative resist. However, only one layer of the multiple photoresist layers can be a positive resist. Otherwise, a first positive resist is also removed during the exposure and development of a second positive resist. Further, if the only positive resist is not the last photoresist layer of the stack of multiple photoresist layers, the developer for the negative resist must not be affective to the positive resist, otherwise the positive resist would generate photoacid after being subjected to the exposure light used in exposing the negative photoresist layer.

In accordance with the present invention, an opening pattern is formed with at least two photoresist layers with, for example, a line/space pattern rather than a hole pattern. Since there is no corner in the line/space pattern, the joint pattern resulted from the patterns of the photoresist layers can avoid corner rounding and the proximity effect. In other words, the profile and the cross-sectional area of an opening formed on the wafer in a subsequent etching process are thus easier to control. If the opening is formed as a contact opening or a via opening, the profile, the cross-sectional area and the resistance of the subsequently formed contact or via are easier to control.

Additionally, since the resolution and the process window for a line/space pattern are better than those for the hole pattern, the line/spacer pattern has a smaller diffraction, a larger depth of focus and a wider process exposure window.

The invention can be applied to the formation of a capacitor of a dynamic random access memory, wherein the bottom electrode of the capacitor is formed by forming an insulation layer, followed by forming an opening in the insulation layer. A bottom electrode plate is further formed in the opening.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming an opening in a wafer layer, the method comprising:

forming a first photoresist layer having at least a first pattern over the wafer layer and forming a second photoresist layer having at least a second pattern over the wafer layer and the first photoresist layer, wherein at least a part of the second pattern is stacked substantially above at least a part of the first pattern to form at least an opening pattern to expose the wafer layer.

2. The method according to claim 1, wherein the opening pattern is formed by a superposition of a first space in the first pattern of the first photoresist layer and a second space in the second pattern of the second photoresist layer.

3. The method according to claim 1, wherein the first photoresist layer and the second photoresist layer are selected from the group consisting of a negative photoresist material and a negative photoresist material, a positive photoresist material and a positive photoresist material, a negative photoresist material and a positive photoresist material, and a positive photoresist material and a negative photoresist material.

4. The method according to claim 1, wherein forming the first photoresist layer having at least the first pattern comprises:

coating a photoresist material on the wafer layer;

performing a soft bake to reduce a solvent of the photoresist material;

performing an exposure step on the photoresist material;

performing a post exposure bake step on the exposed photoresist material;

developing the photoresist material; and performing a hard bake.

5. The method of claim 1, wherein forming the second photoresist layer having at least the second pattern further comprises:

coating a photoresist material on the wafer layer;

performing a soft bake to reduce a solvent of the photoresist material;

performing an exposure step on the photoresist material;

performing a post exposure bake step on the exposed photoresist material; developing the photoresist material; and performing a hard bake.

6. A method for forming at least an opening on a wafer layer, comprising:

forming a first photoresist layer having at least one of first patterns on the wafer layer;

forming a second photoresist layer above the first photoresist layer to fill said one of the first patterns;

planarizing the second photoresist layer; and patterning the second photoresist layer to form at least one of second patterns, wherein at least an opening pattern exposing the wafer layer is formed by stacking said one of the second patterns substantially over said one of the first patterns.

7. The method according to claim 6, wherein the opening pattern is formed by a superpositioning of a first space in the first patterns and a second space in the second patterns.

8. The method according to claim 6, wherein first photoresist layer is a positive resist or a negative resist.

9. The method according to claim 6, wherein the second photoresist layer is a positive or a negative resist.

10. A method for forming an opening in a wafer layer on a substrate, comprising:

forming a first photoresist layer with a plurality of first patterns spaced from each other with a first pitch on the wafer layer;

forming a second photoresist layer with a plurality of second patterns spaced from each other with a second pitch; wherein the second photoresist layer is formed above the first photoresist layer to form an opening pattern by superpositioning a first space between the first patterns and a second space between the second patterns; and forming an opening in the wafer layer exposed by the opening pattern.

11. The method according to claim 10, wherein the opening is a via opening or a contact opening.

12. The method according to claim 10, wherein the opening pattern is defined by sides of the neighboring first patterns in the first photoresist layer and the second patterns in the second photoresist layer.

13. The method according to claim 10, wherein the first photoresist layer is a positive resist or a negative resist.

14. The method of claim 10, wherein the second photoresist layer is a positive resist or a negative resist.

15. The method according to claim 10, wherein forming the first photoresist layer having at least the first pattern further comprises:

coating a photoresist material on the wafer layer;

performing a soft bake to reduce a solvent of the photoresist material;

performing an exposure step on the photoresist material;

performing a post exposure bake step on the exposed photoresist material;

developing the photoresist material; and performing a hard bake step.

16. The method of claim 10, wherein forming the second photoresist layer having at least the second pattern further comprises:

coating a photoresist material on the wafer layer;

performing a soft bake to reduce a solvent of the photoresist material;

performing an exposure step on the photoresist material;

performing a post exposure bake step on the exposed photoresist material; developing the photoresist material; and performing a hard bake step.

* * * * *